(12) United States Patent  
Whittaker

(10) Patent No.: US 9,413,398 B2  
(45) Date of Patent: Aug. 9, 2016

(54) CIRCUITS AND METHODS RELATED TO POWER DETECTORS FOR RADIO-FREQUENCY APPLICATIONS

(71) Applicant: SKYWORKS SOLUTIONS, INC., Woburn, MA (US)

(72) Inventor: Edward John Wemyss Whittaker, Bishop's Storford (GB)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/721,217

(22) Filed: May 26, 2015

(65) Prior Publication Data

US 2015/0349812 A1    Dec. 3, 2015

Related U.S. Application Data

(60) Provisional application No. 62/003,072, filed on May 27, 2014.

(51) Int. Cl.
| | | |
|---|---|---|
| H03F 11/00 | (2006.01) |
| H03F 3/45 | (2006.01) |
| H04L 25/06 | (2006.01) |
| H04B 1/04 | (2006.01) |
| H04W 84/12 | (2009.01) |

(52) U.S. Cl.
CPC .......... *H04B 1/04* (2013.01); *H04B 2001/0408* (2013.01); *H04W 84/12* (2013.01)

(58) Field of Classification Search
USPC ......... 375/219, 211, 258, 257, 295, 297, 316, 375/318, 319, 345, 344, 346, 312, 311, 285, 375/288, 254, 284
See application file for complete search history.

(56) References Cited

U.S. PATENT DOCUMENTS

| | | | | |
|---|---|---|---|---|
| 5,374,899 A * | 12/1994 | Griffiths | ............... | H03F 3/1935 330/277 |
| 6,081,161 A * | 6/2000 | Dacus | ................... | H03F 1/0211 330/285 |
| 6,137,354 A * | 10/2000 | Dacus | ................... | H03F 1/0255 330/151 |
| 8,648,639 B2 * | 2/2014 | Lee | ....................... | H02M 3/156 327/172 |
| 9,294,056 B2 * | 3/2016 | Nobbe | .................... | H03F 3/211 |
| 2005/0110574 A1 * | 5/2005 | Richard | ................. | H03F 3/301 330/297 |
| 2008/0001670 A1 * | 1/2008 | Ripley | .................. | H03F 1/0216 330/285 |
| 2008/0007329 A1 * | 1/2008 | Kim | ..................... | H03F 1/0211 330/51 |
| 2009/0195230 A1 * | 8/2009 | Adkins | ................. | H02M 3/156 323/282 |
| 2009/0261791 A1 * | 10/2009 | Lopata | ................ | H02M 3/1588 323/282 |
| 2010/0118924 A1 * | 5/2010 | Pal | ....................... | H04B 1/0039 375/219 |
| 2013/0114308 A1 * | 5/2013 | Liao | .................. | H02M 3/33507 363/21.01 |
| 2015/0061761 A1 * | 3/2015 | Wills | .................... | H03F 1/0222 330/127 |

OTHER PUBLICATIONS

B. Gilbert, Monolithic Voltage and Current References: Theme and Variations, Analog Circuit Design, 1996, pp. 328, 329, Springer, US.

* cited by examiner

*Primary Examiner* — Linda Wong  
(74) *Attorney, Agent, or Firm* — Chang & Hale LLP

(57) ABSTRACT

Circuits and methods related to power detectors for radio-frequency (RF) applications. In some embodiments, a power amplifier (PA) system can include a PA circuit having a driver stage and an output stage. The PA system can further include a detector configured to receive a portion of an RF signal from a path between the driver stage and the output stage. The detector can be further configured to generate an output signal representative of power associated with the RF signal and compensated for variation in at least one operating condition associated with the PA circuit.

20 Claims, 5 Drawing Sheets

CIRCUITS AND METHODS RELATED TO POWER DETECTORS FOR RADIO-FREQUENCY APPLICATIONS

CROSS-REFERENCE TO RELATED APPLICATION(S)

This application claims priority to U.S. Provisional Application No. 62/003,072 filed May 27, 2014, entitled CIRCUITS AND METHODS RELATED TO POWER DETECTORS FOR RADIO-FREQUENCY APPLICATIONS, the disclosure of which is hereby expressly incorporated by reference herein in its entirety.

BACKGROUND

1. Field

The present disclosure relates to power detectors for radio-frequency (RF) applications.

2. Description of the Related Art

In many radio-frequency (RF) applications an RF signal to be transmitted can be amplified by a power amplifier (PA). Such a PA can include a plurality of stages, such as a driver stage and an output stage. The amplified RF signal output by the PA can be transmitted through an antenna.

SUMMARY

According to a number of implementations, the present disclosure relates to a power amplifier (PA) system that includes a PA circuit having a driver stage and an output stage. The PA system further includes a detector configured to receive a portion of a radio-frequency (RF) signal from a path between the driver stage and the output stage. The detector is further configured to generate an output signal representative of power associated with the RF signal and compensated for variation in at least one operating condition associated with the PA circuit.

In some embodiments, the RF signal can be an output of the driver stage. The PA system can further include a control circuit configured to receive the output signal of the detector and adjust a transmit operation. The transmit operation can be performed by a transmitter circuit which can be part of a transceiver.

In some embodiments, the detector can include a detecting circuit configured to receive the portion of the RF signal and generate a slow-varying or DC voltage Vin representative of the power associated with the RF signal. The detector can further include a compensation circuit configured to receive Vin and generate a compensation signal representative of the variation in at least one operating condition associated with the PA circuit. The compensation signal can include a compensation current Iout resulting from a combination of a current Iin representative of Vin and an operating condition current representative of the at least one operating condition. The current Iin and the operating condition current can be combined by a current multiplier.

In some embodiments, the at least one operating condition can include a PA temperature and a supply voltage. In some embodiments, the detector can further include an output circuit configured to receive Vin and Iout, and generate an output signal having the compensation associated with Iout applied to Vin. The output signal can be an output voltage Vout. The output circuit can be configured such that Vout adds a voltage representative of Iout to Vin.

In some teachings, the present disclosure relates to a method for operating a power amplifier (PA) system. The method includes amplifying a radio-frequency (RF) signal with a PA circuit that includes a driver stage and an output stage. The method further includes obtaining a portion of the RF signal from a path between the driver stage and the output stage. The method further includes generating an output signal representative of power associated with the RF signal and compensated for variation in at least one operating condition associated with the PA circuit. In some embodiments, the at least one operating condition can include either or both of a PA temperature and a supply voltage.

In some implementations, the present disclosure relates to a radio-frequency (RF) module that includes a packaging substrate configured to receive a plurality of components, and a power amplifier (PA) system implemented on the packaging substrate. The PA system includes a PA circuit having a driver stage and an output stage. The PA system further includes a detector configured to receive a portion of a radio-frequency (RF) signal from a path between the driver stage and the output stage. The detector is further configured to generate an output signal representative of power associated with the RF signal and compensated for variation in at least one operating condition associated with the PA circuit.

In some embodiments, the PA circuit can be implemented on a first die, and the detector can be implemented on a second die. In some embodiments, at least some of the PA circuit and at least some of the detector can be implemented on a common die. In some embodiments, substantially all of the PA circuit and substantially all of the detector can be implemented on the common die. In some embodiments, the PA system can be configured to amplify an RF signal for a wireless local area network (WLAN).

In accordance with a number of implementations, the present disclosure relates to a wireless device that includes a transmitter circuit configured to generate a radio-frequency (RF) signal, and a power amplifier (PA) system in communication with the transmitter circuit. The PA system includes a PA circuit having a driver stage and an output stage, and a detector configured to receive a portion of a radio-frequency (RF) signal from a path between the driver stage and the output stage. The detector is further configured to generate an output signal representative of power associated with the RF signal and compensated for variation in at least one operating condition associated with the PA circuit. The wireless device further includes an antenna in communication with the PA system, with the antenna being configured to transmit the RF signal. In some embodiments, the antenna can be a wireless local area network (WLAN) antenna.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many radio-frequency (RF) applications, it is desirable to measure power levels of power amplifiers (PAs). For example, an integrated power detector can be incorporated into a wireless local area network (WLAN) PA to allow a power output level to be set accurately. To provide good directivity, a detector can either utilize a directional coupler on an output stage of a PA, or be implemented to detect a signal at a driver stage of the PA.

Couplers are typically large and can result in loss of some PA power. Accordingly, such couplers are not desirable in some PA applications. In the context of detection at the driver stage, a power detector is typically sensitive to variations in the gain of the output stage which can occur with, for example, variations in supply voltage and/or temperature.

Disclosed herein are circuits, devices and method related to detection of power at an output of a driver stage of a PA. For the purpose of description, it will be understood that such an output of the driver stage can be between the first and last stages in an amplification path with two or more stages. It will also be understood that detection of power as described herein can be implemented on a partially amplified RF signal. Although described in such an example context, it will be understood that one or more features of the present disclosure can also be implemented in other portions of an amplification path of a PA. For the purpose of description, it will be understood that detection of power can include detection of current, voltage, or some combination thereof, associated with RF signals.

Figure 1:
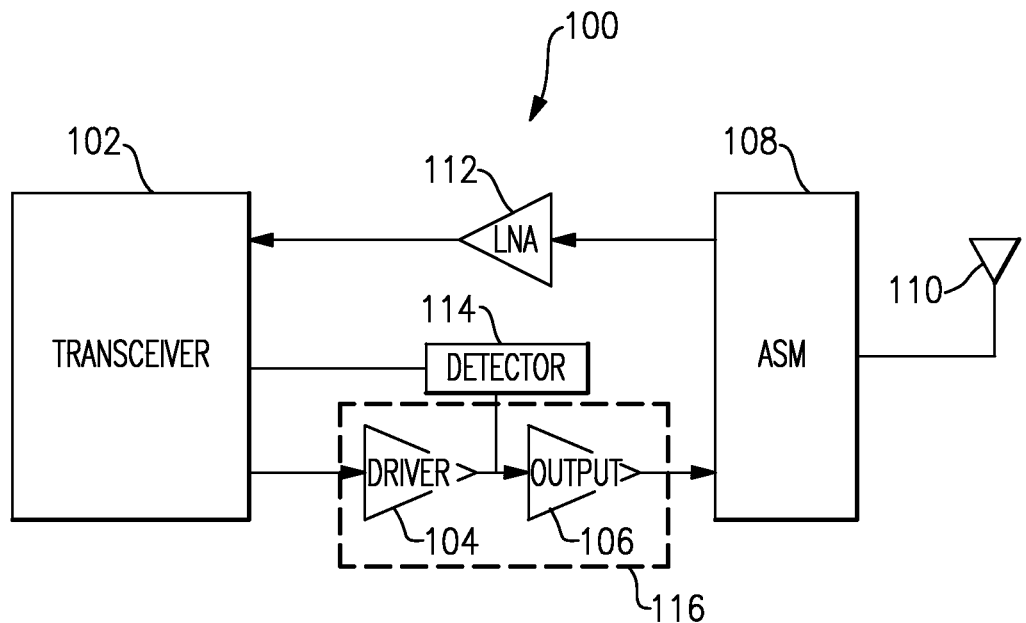
FIG. 1 schematically depicts a radio-frequency (RF) system having a detector implemented to detect power along an RF amplification path between a driver stage and an output stage.

FIG. 1 schematically depicts an RF system 100 having a detector 114 implemented to detect power along an RF amplification path between a driver stage 104 and an output stage 106 of a PA 116. The PA 116 is shown to receive an RF signal to be transmitted from a transceiver 102. The amplified RF signal from the PA 116 can be routed to an antenna 110 through, for example, an antenna switching module (ASM) 108. In some embodiments, such an amplification configuration can be implemented in, for example, a wireless local area network (WLAN) PA system and/or other PA systems.

FIG. 1 further shows that in some embodiments, the detector 114 can be coupled to the transceiver 102. As described herein in greater detail, a control circuit in the transceiver 102 can receive an output signal representative of the detected power from the detector 114. Based on such an output signal, the RF signal generated by the transceiver 102 can be adjusted appropriately.

Figure 2:
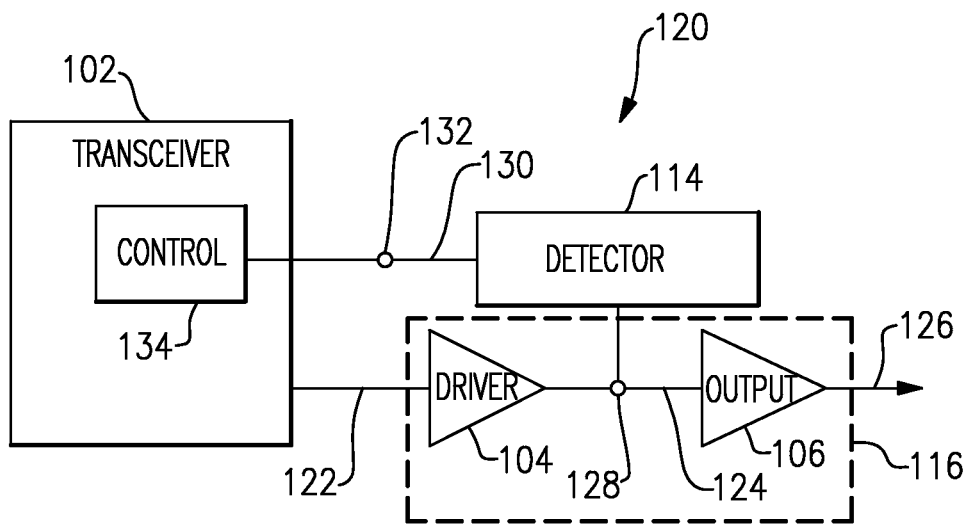
FIG. 2 shows an example of a control system that can be implemented with a detector that measures power associated with a partially amplified RF signal.

FIG. 2 shows an example of a control system 120 that can be implemented with a detector 114 that measures power associated with a partially amplified RF signal. For example, an RF signal generated by a transceiver 102 can be provided to a driver stage 104 of a PA 116 through path 122. A path 124 can be provided between the driver stage 104 and an output stage 106 to route the partially amplified RF signal from the driver stage 104 to the output stage 106. The output stage 106 is shown to yield an amplified RF signal through path 126.

As shown in FIG. 2, the detector 114 can measure the power level associated with the partially amplified RF signal through node 128 along the path 124. As further shown in FIG. 2, the detector 114 can generate and provide a detector signal to a control component 134 that is coupled through, for example, path 130 and node 132. In the example of FIG. 2, the control component 134 is depicted as being part of the transceiver 102; however, it will be understood that some or all of the control component 134 can be implemented at other locations.

Figure 3:
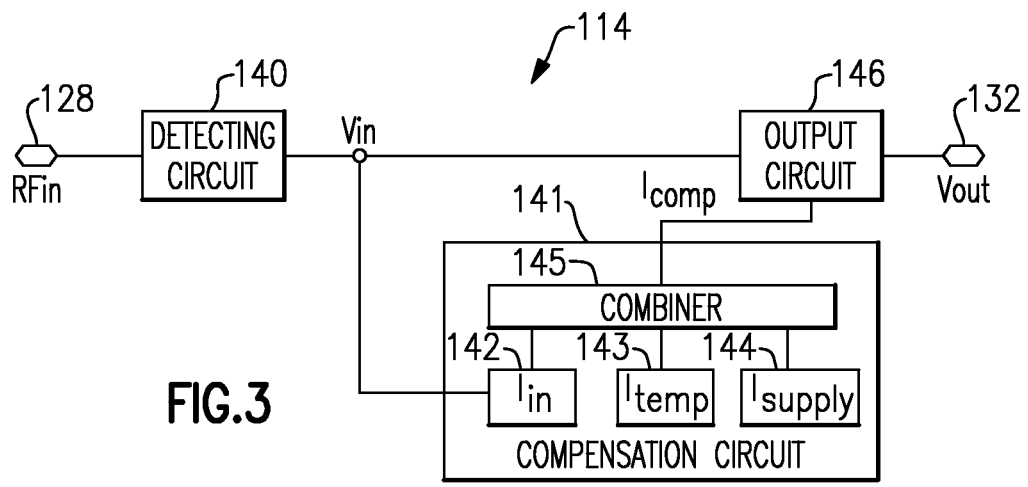
FIG. 3 shows an example configuration of a detector that can be implemented as the detector of FIGS. 1 and 2.

FIG. 3 shows an example configuration of a detector 114 that can be implemented as the detector of FIGS. 1 and 2. In the example of FIG. 3, an input to the detector 114 can be representative of power associated with an RF signal, and such an input can be provided through an RF input (RFin) node 128. Such a node can be, for example, node 128 in FIG. 2. An output signal generated by the detector 114 can be provided as, for example, an output voltage (Vout) at node 132. Such a node can be, for example, node 132 in FIG. 2.

FIG. 3 shows that in some embodiments, the detector 114 can include a detecting circuit 140 configured to receive an input signal sampled from a partially amplified RF signal (e.g., an output of the driver stage). As described herein, the detecting circuit 140 can be configured to receive the input signal and generate a voltage Vin having a magnitude representative of the magnitude of the partially amplified RF signal.

The voltage Vin is shown to be provided to an output circuit 146, as well as to a compensation circuit 141. The compensation circuit 141 is shown to generate a compensation current Icomp based on Vin and one or more currents that correspond to operating condition(s). The compensation current Icomp is shown to be combined with Vin to yield an output voltage Vout that represents the power associated with the partially amplified RF signal, compensated for the one or more operating conditions.

In FIG. 3, the example operating conditions are depicted as temperature of the PA (e.g., PA die temperature) and supply voltage provided to the PA. A current generator 143 can be configured to generate Itemp which is a current representative of the PA temperature; and a current generator 144 can be configured to generate Isupply which is a current representative of the supply voltage. A current generator 142 can be configured to generate Iin which is a current representative of the input voltage Vin.

In some embodiments, the compensation circuit 141 can include a combiner 145 configured to combine Itemp, Isupply, and Iin to generate the compensation current Icomp. Examples of the current generators 142, 143, 144 are described herein in greater detail.

Figure 4:
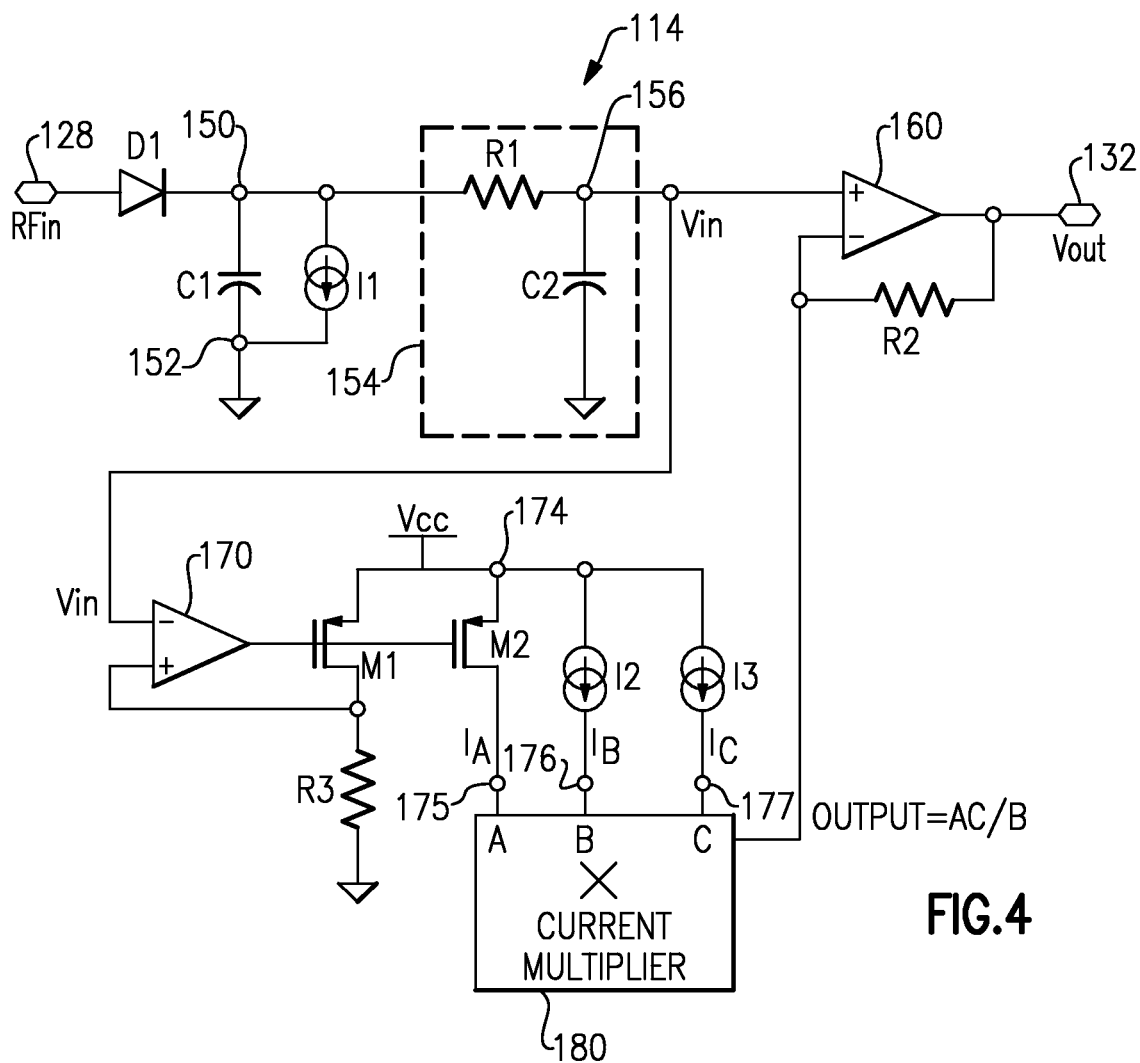
FIG. 4 shows an example of a detector that can be a more specific example of the detector of FIG. 3.

FIG. 4 shows an example of a detector 114 that can be a more specific example of the detector 114 described in reference to FIG. 3. As described herein, the input to the detector 114 can be representative of the power associated with an output of the driver stage. In some embodiments, such an in input can be processed with a diode detection technique. For example, a diode D1 (e.g., a Schottky diode) can receive a sampled RF signal representative of the partially amplified RF signal at the output of the driver stage, and yield a slow-varying or DC current or voltage having a magnitude that is approximately proportional to the magnitude of the sampled RF signal. To achieve such proportionality, the rectified signal at node 150 can charge a capacitance (e.g., a capacitor) C1 to a voltage that is approximately proportional to the sampled RF signal amplitude.

The capacitance C1 is shown to couple node 150 to a signal ground. A current source 11 implemented between node 150 and the signal ground allows a discharge path for the capacitor C1 so that the voltage on node 150 follows the modulation of the RF envelope with most of the RF carrier signal removed. This voltage on node 150 can be passed through a low pass filter 154 (e.g., a 2 MHz low pass filter) to remove or reduce higher frequency components of the modulation to yield an input voltage Vin at node 156. The low pass filter 154 can include, for example, an RF filter in which a resistance R1 is provided between nodes 150 and 156, and a capacitance C1 couples node 156 to the signal ground.

The input voltage Vin resulting from the foregoing diode detector circuit and the low pass filter can be sensitive to variations in the gain of the output stage which can occur when the PA supply voltage and/or the PA temperature are changed. Thus, Vin can be compensated for one or more of such operating conditions. Although described in the context of PA supply voltage and PA temperature, it will be understood that compensation can be based on other operating and/or environmental conditions.

In the example of FIG. 4, compensation for the PA supply voltage variation and the PA temperature variation can be achieved in terms of currents representative of such variations. For example, a current generator 12 can receive a supply voltage Vcc from node 174 and generate a current that corresponds to a change in PA temperature. In some embodiments, the current generator 12 can be configured so that its output current increases when the PA temperature increases. Such an output current can be generated based on, for example, current proportional to absolute temperature.

In another example, a current generator 13 can receive the supply voltage Vcc from node 174 and generate a current that corresponds to a change in the supply voltage itself. For example, the current generator 13 can be configured so that its output current is proportional to the supply voltage. In some embodiments, such a current generator can be configured and operated in a known manner.

As shown in FIG. 4, an op amp 170 combined with first field-effect transistor (FET) M1 (e.g., PFET) and a resistor R3 can cause a current to flow in R3 so that the voltages on the input terminals of the op amp 170 are matched. Thus, in such a configuration, the current in M1 is proportional to Vin. This current in M1 is shown to be mirrored by M2 to produce a current $I_A$ at node 175.

In some embodiments, the current sources 12 and 13 may be used as control elements for a current multiplier 180. As described herein, the current multiplier 180 modifies the current $I_A$ using currents $I_B$ and $I_C$ from their respective sources 12 and 13 to compensate for PA temperature and supply voltage variations.

In the example of FIG. 4, the currents $I_A$, $I_B$ and $I_C$ generally correspond to the currents $I_{in}$, $I_{temp}$ and $I_{supply}$, respectively, as described in reference to FIG. 3. In such a context, $I_A$, $I_B$ and $I_C$ are shown to be provided to the current multiplier 180 through their respective nodes 175, 176, 177. In some embodiments, the current multiplier 180 can be configured to generate an output of AB/C. Accordingly, an output current from the current multiplier 180 can be represented as Iout=$I_A I_B / I_C$=(Vin/R3)$I_B / I_C$.

It will be understood that the foregoing multiplier functionality of AB/C is an example, and that other functions can be implemented by the current multiplier 180. Accordingly, the output current can be represented in a more general form as Iout=(Vin/R3)×f(Vbat, temp), where f(Vbat, temp) is a function of Vbat and temperature.

In FIG. 4, such an output current Iout from the current multiplier 180 is shown to be provided to an inverting input of an op amp 160. Vin from node 156 is shown to be provided to a non-inverting input of the op amp 160. An output Vout of the op amp 160 is shown to be provided to an output node 132, as well as to the inverting input through a resistance R2 to form a negative feedback loop. Such a configuration can result in the output voltage Vout to be Vin plus Iout scaled by the feedback loop resistance R2. Accordingly, Vout can be expressed as Vout=Vin+(Iout)(R2). Since Iout=(Vin/R3)×f(Vbat, temp), Vout can be expressed as Vout=Vin[1+(R2/R3) f(Vbat, temp)].

It is noted that in some embodiments, all of the detector signal (e.g., at node 156) can be put through the compensation loop and not use the positive terminal of the op amp 160. However, such a configuration may be subjected to offset problems that can affect current multiplier circuits for variations in Vin that may not be too large. For example, voltage Vin can vary in the order of about 20% for temperature changes of −40 degree to +120 degree and supply voltage changes of 3V to 5V.

In the example of FIG. 4, Vout reflects compensation of the measured power associated with the input RF signal (RFin). As described herein, such a compensation can include either or both of PA temperature and supply voltage. It will be understood that compensation can also be performed for other operating conditions.

Figure 5:
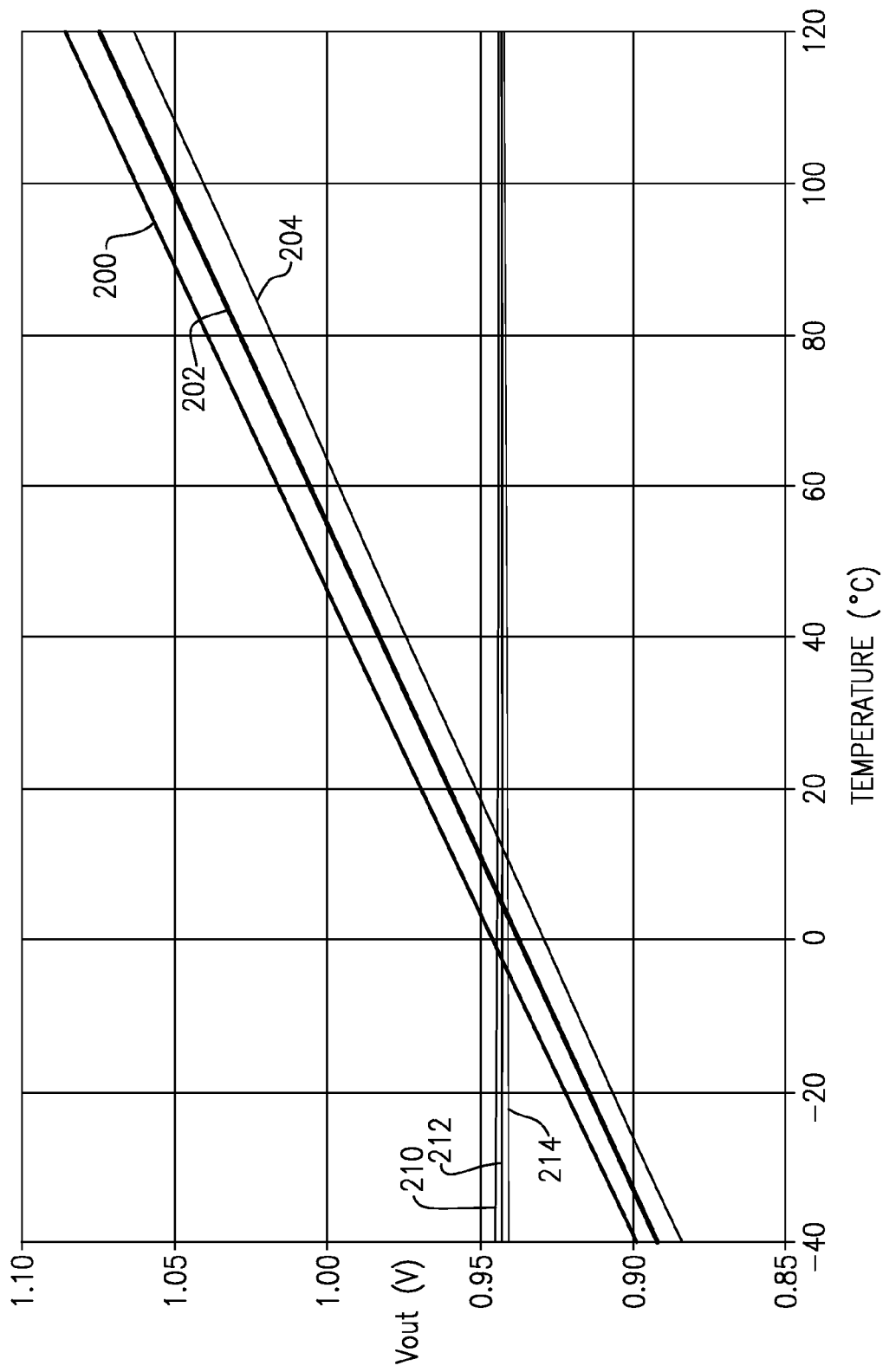
FIG. 5 shows examples of how the compensated Vout in FIG. 4 can have reduced sensitivity to variations in PA temperature and supply voltage.

FIG. 5 shows examples of how the compensated Vout in FIG. 4 can have reduced sensitivity to PA temperature and supply voltage. In FIG. 5, various Vout curves are plotted as a function of PA temperature. Curves 200, 202, 204 are for Vout without compensation, and curves 210, 212, 214 are for Vout with compensation. For the uncompensated curves 200, 202, 204, Vout can be Vin (e.g., at node 156 in FIG. 4). For the compensated curves 210, 212, 214, Vout can be obtained from the output node 132 in FIG. 4.

In FIG. 5, the curve 200 is obtained at a supply voltage of 3.0V; the curve 202 is obtained at a supply voltage of 3.3V; and the curve 204 is obtained at a supply voltage of 3.6V. The curve 210 is obtained at a supply voltage of 3.6V; the curve 212 is obtained at a supply voltage of 3.3V; and the curve 214 is obtained at a supply voltage of 3.0V. From the two groups of curves (200, 202, 204 in the uncompensated configuration, and 210, 212, 214 in the compensated configuration), one can see that the uncompensated detector output has a significant dependence on the PA temperature, while the compensated detector output is essentially insensitive to PA temperature variation. One can also see that for the uncompensated configuration, variation in the supply voltage results in noticeable shifts of the detector output. For the compensated configuration, the detector output is again essentially insensitive to supply voltage variation.

In some embodiments, at least a portion of a detector having one or more features as described herein (e.g., 114 in FIGS. 1-4) can be implemented on a semiconductor die. Such a semiconductor die may or may not be the same die on which the PA (e.g., 116 in FIGS. 1 and 2) is implemented. For example, both of the detector 114 and the PA 116 can be implemented on a BiCMOS die. In another example, if the PA 116 is implemented on a GaAs die, it may not be desirable or practical to implement the detector 114 on the same die. Accordingly, the detector 114 can be implemented on a die that is different from the PA die.

Figure 6:
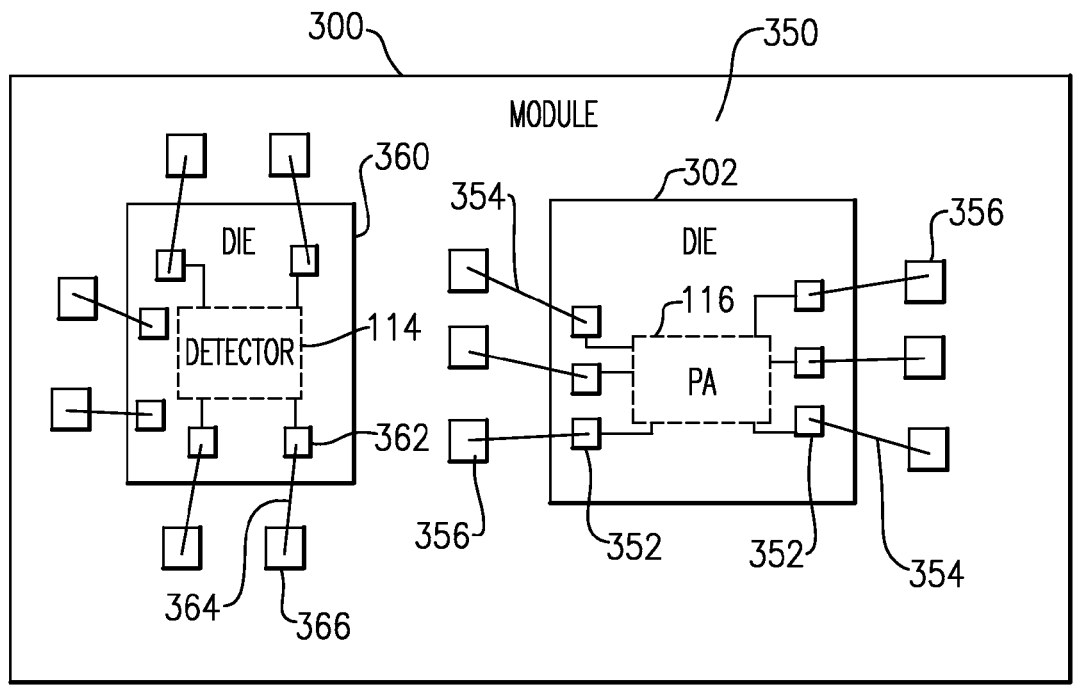
FIG. 6 shows an example of a packaged module where a detector having one or more features as described herein can be implemented on a die that is separate from a die having a PA.

FIG. 6 shows an example of a packaged module 300 where a detector 114 having one or more features as described herein can be implemented on a die 360 that is separate from a die 302 having a PA 116. In the example of FIG. 6, both of the die 360, 302 are shown to be mounted on a packaging substrate 350 that is configured to receive a plurality of components. Such components can include one or more die, such as the example die 360, 302, as well as one or more surface mounted devices (SMDs) such as passive components. In some embodiments, the packaging substrate 350 can include, for example, a laminate substrate.

In the example of FIG. 6, the die 360 can include a plurality of electrical contact pads 362 configured to allow formation of electrical connections 364 such as wirebonds between the die 360 and contact pads 366 formed on the packaging substrate 350. Similarly, the die 302 can include a plurality of electrical contact pads 352 configured to allow formation of electrical connections 354 such as wirebonds between the die 302 and contact pads 356 formed on the packaging substrate 350.

Figure 7:
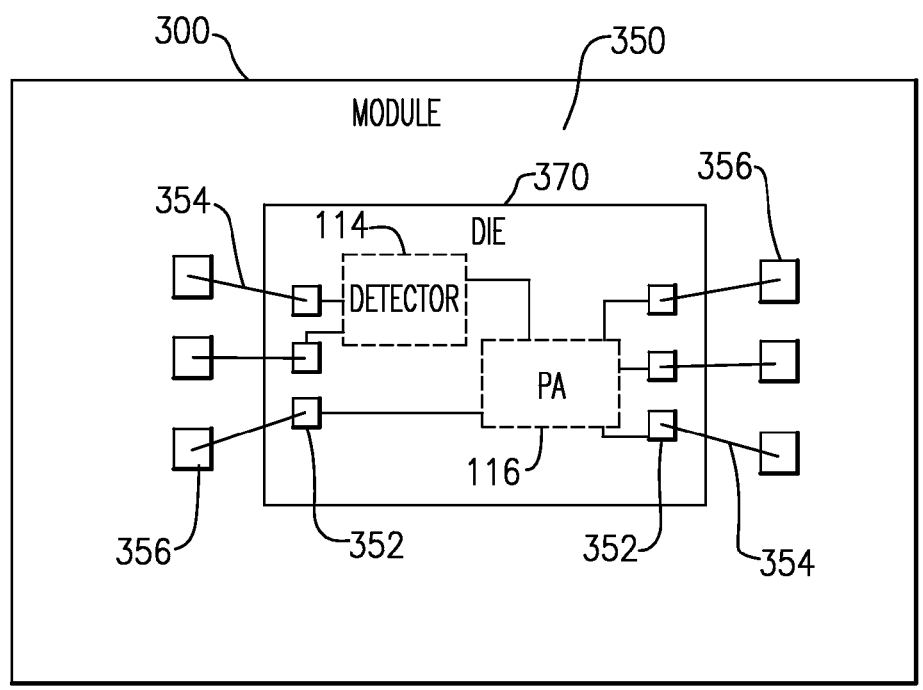
FIG. 7 shows an example of a packaged module where a detector having one or more features as described herein can be implemented on a die that also includes a PA.

FIG. 7 shows an example of a packaged module 300 where a detector 114 having one or more features as described herein can be implemented on a die 370 that also includes a PA 116. In the example of FIG. 7, the die 370 is shown to be mounted on a packaging substrate 350 that is configured to receive a plurality of components. Such components can include one or more die, such as the example die 370, as well as one or more surface mounted devices (SMDs) such as passive components. In some embodiments, the packaging substrate 350 can include a laminate substrate. In the example of FIG. 7, the die 370 can include a plurality of electrical contact pads 352 configured to allow formation of electrical connections 354 such as wirebonds between the die 370 and contact pads 356 formed on the packaging substrate 350.

In some embodiments, each of the modules 300 of FIGS. 6 and 7 can also include one or more packaging structures to, for example, provide protection and facilitate easier handling of the module 300. Such a packaging structure can include an overmold formed over the packaging substrate 350 and dimensioned to substantially encapsulate the various circuits and components implemented on the packaging substrate. It will be understood that although the module 300 is described in the context of wirebond-based electrical connections, one or more features of the present disclosure can also be implemented in other packaging configurations, including flip-chip configurations.

In some embodiments, a die having the PA 116 with its detector 114 can implemented in a packaging configuration that does not necessarily rely on a laminate substrate. For example, such a die can be implemented directly in a QFN type package and not rely on a laminate.

It will also be understood that although the examples of FIGS. 6 and 7 are described in the context of wirebond die, one or more features of the present disclosure can be implemented in other types of die. For example, a flip chip PA die can include some or all of a detector 114 as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 8:
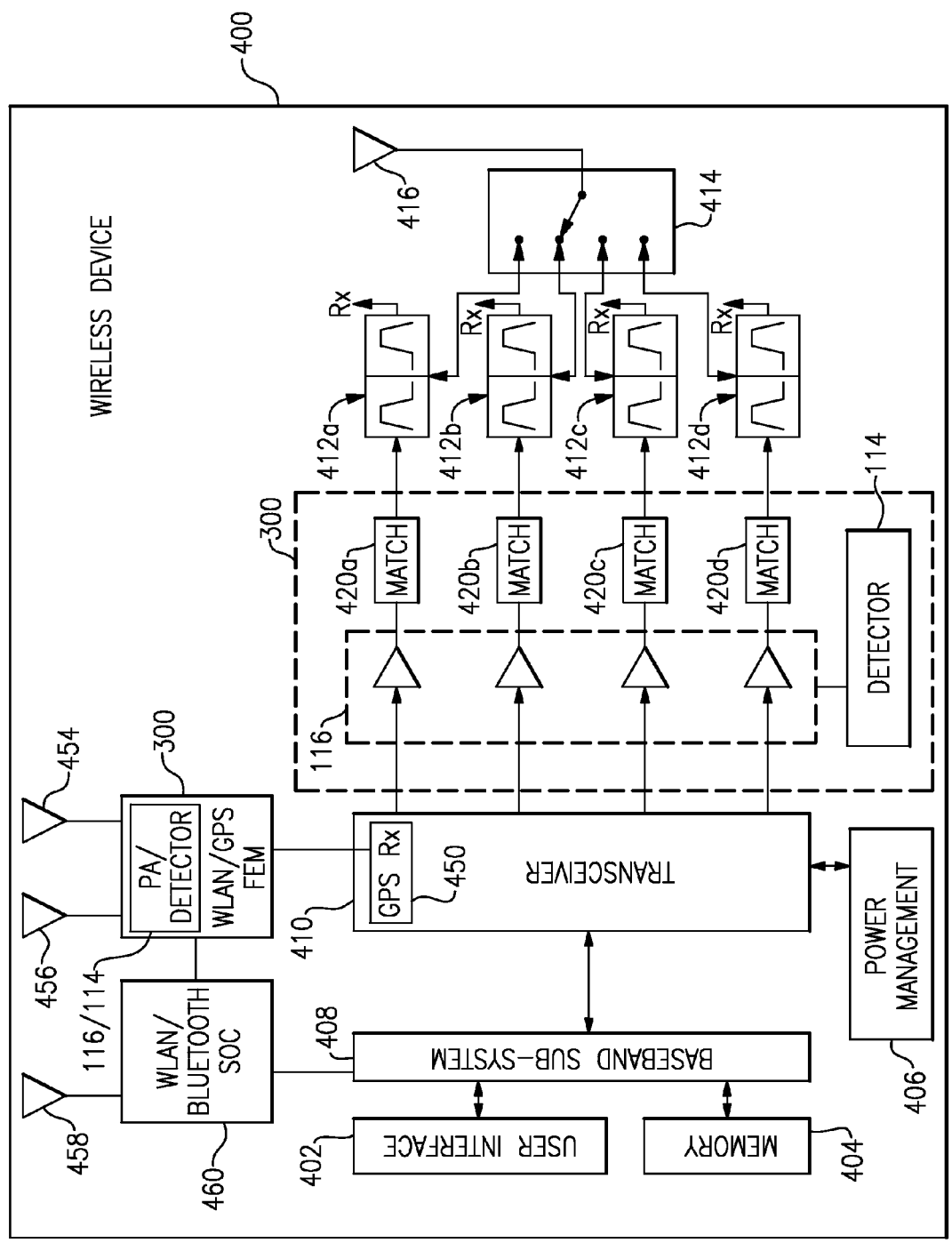
FIG. 8 depicts an example wireless device having one or more advantageous features described herein.

FIG. 8 schematically depicts an example wireless device 400 having one or more advantageous features described herein. In the context of various configurations described herein, one or more modules having functionality depicted as 300 can be included in the wireless device 400. As described herein, such a module can include functionality associated with a detector 114 having one or more features as described herein, and functionality associated with a PA 116.

For example, a front-end module (FEM) 300 for WLAN/GPS operations can include a PA 116 and a detector 114 having one or more features as described herein. Such a PA can be configured to amplify a WLAN signal for transmission through an antenna 456. Such a WLAN signal can be generated by a baseband sub-system 408 and routed to the FEM 300 through a WLAN/Bluetooth system-on-chip (SOC) 460.

In the example of FIG. 8, transmission and reception of Bluetooth signals can be facilitated by an antenna 458. In the example shown, GPS functionality can be facilitated by the FEM 300 in communication with a GPS antenna 454 and a GPS receiver 450.

In another example, an RF PA module depicted as 300 can include one or more features as described herein. Such an RF PA module 300 can include one or more bands, and each band can include one or more amplification stages. One or more of such amplification stages can be in communication with one or more detectors (114) and benefit from the compensated power detection techniques as described herein.

In the example wireless device 400, the RF PA module 300 having a plurality of PAs can provide an amplified RF signal to a switch 414 (via duplexer 412), and the switch 414 can route the amplified RF signal to an antenna 416. The PA module 300 can receive an unamplified RF signal from a transceiver 410.

The transceiver 410 can also be configured to process received signals. Such received signals can be routed to an LNA (not shown) from the antenna 416, through the duplexer 412. As described herein, the transceiver 410 can also include a controller (e.g., 134 in FIG. 2) configured to receive the detected power signal and operate the transceiver 410 accordingly.

The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such a power management component can also control operations of the baseband sub-system 408, as well as other components.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) system comprising:
a PA circuit including a driver stage and an output stage; and
a detector configured to receive a portion of a radio-frequency (RF) signal from a path between the driver stage and the output stage and generate a slow-varying or DC voltage as an input voltage Vin representative of power associated with the RF signal, the detector further configured to generate an output signal representative of power associated with the RF signal and compensated for variation in at least one operating condition associated with the PA circuit, the output signal based on a compensation current Iout resulting from a combination of a current Iin representative of the input voltage Vin and at least one operating condition current representative of the respective at least one operating condition.

2. The PA system of claim 1 wherein the RF signal is an output of the driver stage.

3. The PA system of claim 1 further comprising a control circuit configured to receive the output signal of the detector and adjust a transmit operation.

4. The PA system of claim 3 wherein the transmit operation is performed by a transmitter circuit.

5. The PA system of claim 4 wherein the transmitter circuit is part of a transceiver.

6. The PA system of claim 1 wherein the detector includes a detecting circuit configured to generate the input voltage Vin, the detecting circuit including a diode configured by rectify the RF signal, and a capacitor circuit configured to yield a voltage that is approximately proportional to an amplitude of the rectified RF signal.

7. The PA system of claim 6 wherein the detector further includes a compensation circuit configured to generate the compensation current Iout by combining the current Iin with the at least one operating condition current.

8. The PA system of claim 7 wherein compensation circuit is configured such that the current Iin is proportional to the input voltage Vin, and the at least one operating condition current is proportional to the corresponding operating condition.

9. The PA system of claim 8 wherein the current Iin and the at least one operating condition current are combined by a current multiplier.

10. The PA system of claim 8 wherein the at least one operating condition current includes a current proportional to a PA temperature and a current proportional to a supply voltage.

11. The PA system of claim 8 wherein the detector further includes an output circuit configured to receive the input voltage Vin and the compensation current Iout, the output circuit further configured to generate the output signal by combining the compensation current Iout and the input voltage Vin.

12. The PA system of claim 11 wherein the output signal is an output voltage Vout.

13. The PA system of claim 12 wherein the output circuit is configured such that Vout adds a voltage representative of Iout to the input voltage Vin.

14. A method for operating a power amplifier (PA) system, the method comprising:
obtaining a portion of a radio-frequency (RF) signal from a path between a driver stage and a output stage of a PA circuit;
generating, from the portion of the RF signal, a slow-varying or DC voltage as an input voltage Vin representative of power associated with the RF signal; and
generating an output signal based on a compensation current Iout resulting from a combination of a current Iin representative of the input voltage Vin and at least one operating condition current representative of a respective at least one operating condition associated with the PA circuit, such that the output signal is representative of the power associated with the RF signal and compensated for variation in the at least one operating condition.

15. The method of claim 14 wherein the at least one operating condition includes either or both of a PA temperature and a supply voltage.

16. A radio-frequency (RF) module comprising:
a packaging substrate configured to receive a plurality of components; and a power amplifier (PA) system implemented on the packaging substrate, the PA system including a PA circuit having a driver stage and an output stage, the PA system further including a detector configured to receive a portion of an RF signal from a path between the driver stage and the output stage and generate a slow-varying or DC voltage as an input voltage Vin representative of power associated with the RF signal, the detector further configured to generate an output signal representative of power associated with the RF signal and compensated for variation in at least one operating condition associated with the PA circuit, the output signal based on a compensation current Iout resulting from a combination of a current Iin representative of the input voltage Vin and at least one operating condition current representative of the respective at least one operating condition.

17. The RF module of claim 16 wherein the PA circuit is implemented on a first die, and the detector is implemented on a second die.

18. The RF module of claim 16 wherein at least some of the PA circuit and at least some of the detector are implemented on a common die.

19. The RF module of claim 18 wherein all of the PA circuit and all of the detector are implemented on the common die.

20. The RF module of claim 16 wherein the PA system is configured to amplify an RF signal for a wireless local area network (WLAN).

* * * * *